(12) United States Patent
Xiong et al.

(10) Patent No.: US 10,001,589 B2
(45) Date of Patent: Jun. 19, 2018

(54) MASK ASSEMBLY, COLOR FILTER SUBSTRATE AND METHOD OF MANUFACTURING THE SAME

(71) Applicants: BOE Technology Group Co., Ltd., Beijing (CN); Chongqing BOE Optoelectronics Technology Co., Ltd., Chongqing (CN)

(72) Inventors: Qiang Xiong, Beijing (CN); Hongjiang Wu, Beijing (CN); Ruilin Bi, Beijing (CN); Hongyu Sun, Beijing (CN); Zili Han, Beijing (CN); Yuanhong Peng, Beijing (CN); Min Li, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 94 days.

(21) Appl. No.: 15/236,558

(22) Filed: Aug. 15, 2016

(65) Prior Publication Data
US 2017/0192143 A1    Jul. 6, 2017

(30) Foreign Application Priority Data
Jan. 4, 2016   (CN) .......................... 2016 1 0006525

(51) Int. Cl.
*G02F 1/1335* (2006.01)
*G02B 5/20* (2006.01)
*G03F 7/20* (2006.01)

(52) U.S. Cl.
CPC ............... *G02B 5/201* (2013.01); *G03F 7/70* (2013.01); *G03F 7/70633* (2013.01)

(58) Field of Classification Search
CPC ........ G02B 5/201; G03F 7/70; G03F 7/70633
USPC ....................................................... 349/106
See application file for complete search history.

(56) References Cited

U.S. PATENT DOCUMENTS

| | | | |
|---|---|---|---|
| 2007/0001597 A1* | 1/2007 | Yang .................... | G02F 1/13454 313/506 |
| 2009/0011567 A1* | 1/2009 | Li ....................... | G02F 1/133707 438/401 |
| 2012/0229740 A1* | 9/2012 | Tsai ................... | G02F 1/133514 349/106 |

(Continued)

*Primary Examiner* — Hoan C Nguyen
(74) *Attorney, Agent, or Firm* — Westman, Champlin & Koehler, P.A.

(57) ABSTRACT

The present disclosure provides a mask assembly, a color filter substrate and a method of manufacturing the same. The mask assembly includes: a first mask formed with a plurality of first black matrix marking mask patterns at a position corresponding to each marking region, a spacing between centers of two first black matrix marking mask patterns that are the closest to each other among the first black matrix marking mask patterns being not less than two times of a spacing between centers of two adjacent sub-pixels located in a same row; and a second mask formed with a plurality of photoresist block mask patterns at a position corresponding to the color filtering region, and further formed with at least two photoresist marking mask patterns, which are located at a position corresponding to each marking region and arranged in a column direction.

8 Claims, 5 Drawing Sheets

(56) References Cited

U.S. PATENT DOCUMENTS

2015/0333015 A1* 11/2015 Fu ........................ H01L 27/1214
257/797
2017/0097549 A1* 4/2017 Xiong ............... G02F 1/136209

* cited by examiner

MASK ASSEMBLY, COLOR FILTER SUBSTRATE AND METHOD OF MANUFACTURING THE SAME

CROSS-REFERENCE TO RELATED APPLICATION

This application claims the benefit of Chinese Patent Applications No. 201610006525.5 filed on Jan. 4, 2016 in the State Intellectual Property Office of China, the disclosures of which are incorporated herein by reference.

BACKGROUND OF THE INVENTION

Field of the Invention

The present disclosure relates to the field of display technologies, and particularly, to a mask assembly, a color filter substrate and a method of manufacturing the same.

Description of the Related Art

Figure 1:
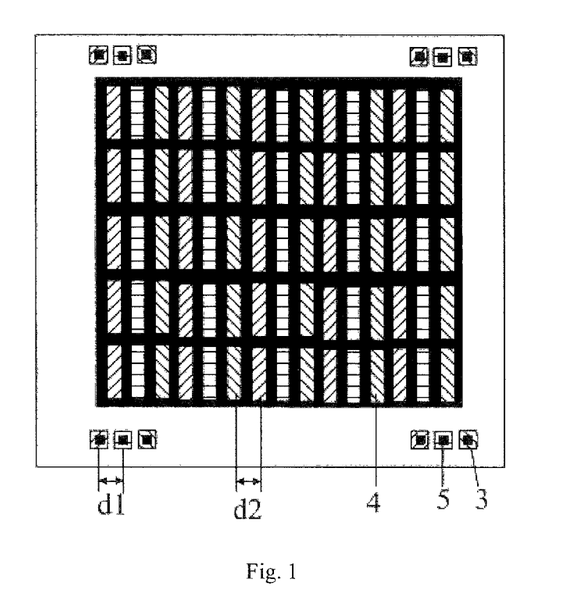
FIG. 1 is a structural schematic diagram of a color filter substrate in prior arts.

A color filter substrate mainly comprises a base substrate, an indium tin oxide film for a back plate, a black matrix, a color filter layer, a layer of protection film and spacers. In order to detect production precision of respective layers, as shown in FIG. 1, the color filter substrate includes a plurality of marking regions located close to corners thereof, and a plurality of black matrix marking blocks 5 and a plurality of photoresist marking blocks 3 of different colors are provided within each marking region. The black matrix marking blocks 5 and the black matrix are formed simultaneously, and the photoresist marking blocks 3 of each color and the photoresist blocks 4 of the same color are formed simultaneously. The plurality of black matrix marking blocks 5 are covered by the photoresist marking blocks 3 of different colors. After manufacturing of the color filter substrate is completed, a detection device is used to detect whether or not a center of each photoresist marking block 3 is aligned with a center of a corresponding black matrix marking block 5. If the centers of the photoresist marking block and the corresponding black matrix marking block are aligned with each other, it indicates that the color-filtering photoresist blocks in a display area are located in place; otherwise, it indicates that there is an offset in positions of the color-filtering photoresist blocks within the display area.

Figure 2:
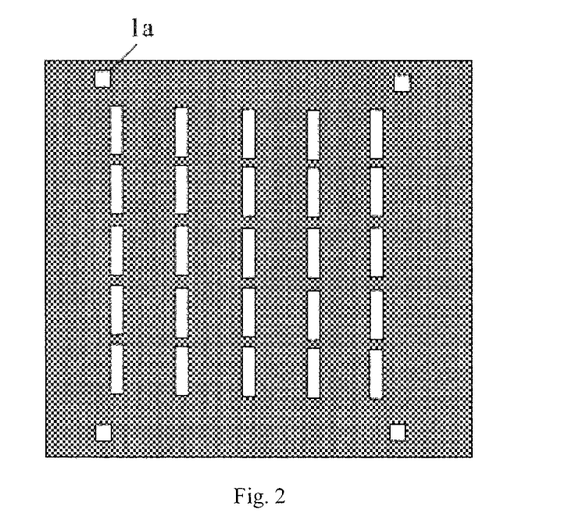
FIG. 2 is a structural schematic diagram of a mask for manufacturing a color filter layer of the color filter substrate in prior arts.
Figure 3:
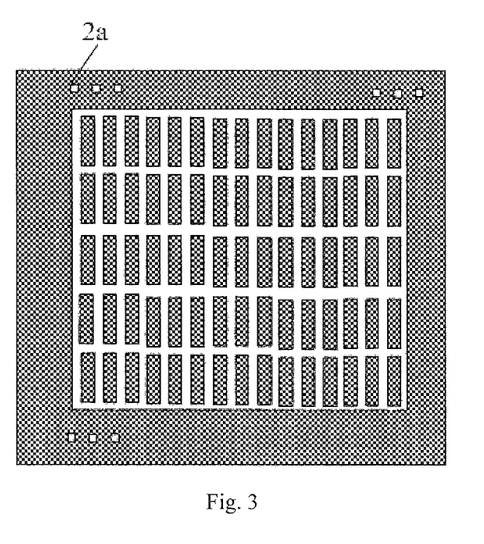
FIG. 3 is a structural schematic diagram of a mask for manufacturing a black matrix layer in prior arts.
Figure 4:
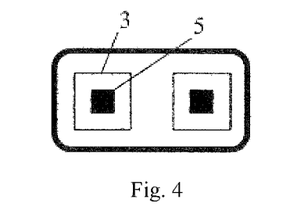
FIG. 4 a schematic diagram showing an image at a detection window obtained when detecting the color filter substrate in prior arts.

In order to reduce costs of manufacturing the color filter substrate, the photoresist blocks of different colors are manufactured by using a same mask as shown in FIG. 2 when manufacturing the color filter layer. The mask is provided with a first light transmission hole 1a at a position corresponding to each marking region, such that when the photoresist block of each color is formed, a photoresist marking block of a corresponding color is formed within the marking region of the base substrate. A mask for manufacturing the black matrix is shown in FIG. 3, and is provided with a plurality of second light transmission holes 2a at a position corresponding to each marking region. Thus, after manufacturing of the color filter substrate is completed, a spacing d1 between centers of two adjacent photoresist marking blocks 3 is equal to a spacing d2 between centers of two adjacent photoresist blocks 4 in a same row. Two black matrix marking blocks 5 and two corresponding photoresist marking blocks 3 (photoresist block alignment marks) will be presented in a field of view when a detection is made by using the detection device, as shown in FIG. 4. Thus, the two photoresist marking blocks cannot be differentiated from each other due to factors such as brightness of light, which will easily result in an error in recognition, thereby reducing accuracy of detection result.

SUMMARY

The present disclosure is to provide a mask assembly, a color filter substrate and a method of manufacturing the same, for enabling improvement on detection accuracy of the color filter substrate without increasing manufacturing costs.

The present disclosure provides a mask assembly for manufacturing a color filter substrate, the color filter substrate comprising a color filtering region and a plurality of marking regions, the color filtering region being divided into a plurality of pixel units each comprising a plurality of sub-pixels of different colors arranged in a row direction, wherein the mask assembly comprises:

a first mask formed with a plurality of first black matrix marking mask patterns at a position corresponding to each of the marking regions, a spacing between centers of two of the first black matrix marking mask patterns that are the closest to each other among the first black matrix marking mask patterns being not less than two times of a spacing between centers of two adjacent ones of the sub-pixels located in the same row; and a second mask formed with a plurality of photoresist block mask patterns at a position corresponding to the color filtering region in a one-to-one correspondence to a plurality of the sub-pixels having the same one color, and with at least two photoresist marking mask patterns, which are located at a position corresponding to each of the marking regions and arranged in a column direction;

wherein a plurality of the first black matrix marking mask patterns corresponding to the same marking region are configured to form a plurality of first projections within the marking region when the first mask is aligned with the color filter substrate, and a plurality of the photoresist marking mask patterns corresponding to the same marking region are configured to form a plurality of columns of second projections within the marking region when the photoresist block mask patterns of the second mask are respectively aligned with sub-pixels of respective colors, and wherein in the same marking region, at least two of the first projections respectively correspond to different columns of the second projections, and the first projections are respectively located within corresponding second projections.

Preferably, the number of the first black matrix marking mask patterns of the first mask formed at a position corresponding to any one of the marking regions is equal to the number of color kinds of the sub-pixels of the pixel unit, and the plurality of the first projections respectively correspond to a plurality of the second projections each located in different columns within the same marking region in a one-to-one relationship.

Preferably, the second mask is formed with two photoresist marking mask patterns at a position corresponding to each of the marking regions, and the first mask is formed with three first black matrix marking mask patterns at a position corresponding to each of the marking regions, and two of the three first black matrix marking mask patterns are located in the same row, and a perpendicular bisector for a connection line between centers of the two first black matrix marking mask patterns passes through the third one of the three first black matrix marking mask patterns.

Preferably, the mask assembly further comprises a third mask for forming a spacer layer of the color filter substrate, the third mask is formed with at least one spacer marking mask patterns at a position corresponding to each of the marking regions, and the first mask is further formed with a second black matrix marking mask pattern at a position corresponding to the marking region, and an orthogonal projection of the second black matrix marking mask pattern on the color filter substrate is located within an orthogonal projection of the spacer marking mask pattern on the color filter substrate when both the first mask and the third mask are aligned with the color filter substrate.

Preferably, each of the length and the width of the first black matrix marking mask pattern is in a range of 45~50 µm, and each of the length and the width of the second black matrix marking mask pattern is in a range of 45~50 µm.

Preferably, a spacing between centers of two adjacent ones of the photoresist marking mask patterns at a position of the second mask corresponding to the same marking region is in a range of 300~320 µm.

Preferably, each of the length and the width of the photoresist marking mask pattern is in a range of 85~95 µm.

Preferably, the first mask is further formed with a grid shaped black matrix mask patterns at a position corresponding to the color filtering region.

Correspondingly, the present disclosure further provides a method of manufacturing a color filter substrate by using the mask assembly as described above, the method comprises steps of:

S1: forming a black matrix material layer;

S2: exposing and developing the black matrix material layer through the first mask so as to form a plurality of first black matrix marking blocks corresponding to the first black matrix marking mask patterns; and S3: forming respectively photoresist blocks of a plurality of different colors, wherein forming the photoresist blocks of a respective one of the colors comprises:

S3a: form a photoresist material layer of the respective color; and

S3b: exposing and developing the photoresist material layer through the second mask so as to form a plurality of photoresist blocks of the respective color corresponding to the photoresist mask patterns while forming a plurality of photoresist marking blocks of the respective color corresponding to the photoresist marking mask patterns; and wherein at least two first black matrix marking blocks located within the same marking region are covered by the photoresist marking blocks of different colors.

Preferably, the number of the first black matrix marking mask patterns of the first mask formed at a position corresponding to any one of the marking regions is equal to the number of color kinds of the photoresist blocks to be formed, and after the step S3, a plurality of the first black matrix marking blocks located within the same marking region are respectively covered by a plurality of photoresist marking blocks each having different colors.

Preferably, the first mask is further formed with second black matrix marking mask patterns at a position corresponding to each of the marking regions, such that there are further formed in the step S2 with second black matrix marking blocks corresponding to the second black matrix marking mask patterns, and the method further comprises, following the step S3, steps of:

S4: forming a spacer material layer; and

S5: exposing and developing the spacer material layer so as to form spacer marking blocks to cover the second black matrix marking blocks.

Correspondingly, the present disclosure further provides a comprising a color filtering region and a plurality of marking regions, the color filtering region being divided into a plurality of pixel units each comprising a plurality of sub-pixels of different colors arranged in a row direction, wherein a plurality of photoresist marking block are arranged in at least two rows within each of the marking regions, such that the photoresist marking blocks located in different columns have different colors while the photoresist marking blocks located in the same column have the same color, and that a spacing between centers of two adjacent ones of the photoresist marking blocks located in the same row is equal to a spacing between centers of two adjacent ones of the sub-pixels located in the same row; and a plurality of first black matrix marking blocks are further provided within each of the marking regions, such that at least two of the first black matrix marking blocks located within the same marking region are respectively covered by the photoresist marking blocks of different colors, and that a spacing between centers of two of the first black matrix marking blocks that are the closest to each other among the first black matrix marking blocks is not less than two times of a spacing between centers of two adjacent ones of the photoresist blocks located in the same row.

Preferably, the number of the first black matrix marking blocks located within any one of the marking regions is equal to the number of color kinds of the photoresist blocks in the pixel unit, and a plurality of the first black matrix marking blocks located within the same marking region are respectively covered by the photoresist marking blocks of different colors.

Preferably, three photoresist blocks are provided within each pixel unit, a plurality of the photoresist marking blocks arranged in two rows and three columns and three first black matrix marking blocks are provided within each of the marking regions, and the three first black matrix marking blocks are respectively covered by a middle one of the photoresist marking blocks in the first row and two photoresist marking blocks located in the beginning and the end of the second row.

Preferably, at least one spacer marking block and one second black matrix marking block that is arranged in the same layer as the first black matrix marking block are further provided within each of the marking regions, the second black matrix marking block is covered by the spacer marking block, and a spacing between centers of the second black matrix marking block and the first black matrix marking block which is located at the nearest distance from the second black matrix marking block is not less than two times of a spacing between centers of two adjacent ones of the photoresist blocks in the same row.

Preferably, a cross section of the first black matrix marking block has a rectangular shape with a length and a width each in a range of 45~50 µm, and a cross section of the second black matrix marking block has a rectangular shape with a length and a width each in a range of 45~50 µm.

Preferably, a spacing between centers of two adjacent photoresist marking blocks of the same color located within the same marking region is in a range of 300~320 µm.

Preferably, a cross section of the photoresist marking block has a rectangular shape with a length and a width each in a range of 85~95 µm.

Preferably, a grid shaped black matrix is further arranged within the color filtering region in same layer as the first black matrix marking block, each grid corresponding to one of the photoresist blocks.

In any of the marking regions of the color filter substrate manufactured by using the mask assembly provided according to the present disclosure, a spacing between centers of two adjacent ones of the photoresist marking blocks located in the same row is equal to a spacing between centers of two adjacent ones of the photoresist blocks located in the same row, such that when manufacturing the color filter substrate, photoresist blocks of different colors and photoresist marking blocks of different colors may be manufactured by using the same one mask, thereby saving manufacturing cost. Further, a spacing between centers of two of the first black matrix marking blocks that are the closet to each other among the first black matrix marking blocks is not less than two times of a spacing between centers of two adjacent ones of the photoresist blocks located in the same row, such that when a detection device is used to detect whether or not the photoresist marking block is aligned with the first black matrix marking block, there will be only one first black matrix marking block within a detection window, and the detection device can determine a central position of the first black matrix marking block only based on a profile of the first black matrix marking block and determine a center of the photoresist marking block corresponding to the first black matrix marking block. Thus, only one set of detection values will be obtained for each detection, thereby improving accuracy of detection result.

BRIEF DESCRIPTION OF THE DRAWINGS

Accompanying drawings are provided for further understanding of the present disclosure, as parts of the specification, and for illustrating, together with following exemplary embodiments, the present disclosure, and should not be construed as a limit to the invention. In the drawings.

LIST OF REFERENCE NUMERALS

1*a*: first light transmission hole; 2*a*: second light transmission hole; 3: photoresist marking block in prior arts; 4: photoresist block in prior arts; 5: black matrix marking block in prior arts; 10: first mask; 11: first black matrix marking mask pattern; 12: second black matrix marking mask pattern; 13: black matrix mask pattern; 20: second mask; 21: photoresist block mask patterns; 22: photoresist marking mask pattern; 30: third mask; 31: spacer marking mask pattern; 32: spacer mask pattern; 40: base substrate; 41: first black matrix marking block; 42: second black matrix marking block; 43: photoresist marking block; 44: photoresist block; 45: black matrix; 46: spacer marking block; 50: color filtering region; 501 and 502: pixel units; 501*a*-501*c* and 502*a*-502*b*: sub-pixels of pixel units; 51: marking region; and 100: color filter substrate.

DETAINED DESCRIPTION OF PREFERRED EMBODIMENTS OF THE INVENTION

In the following detailed description, numerous specific details are set forth in order to provide a thorough understanding of the disclosed embodiments. It will be apparent, however, that the present disclosure may be practiced with other embodiments different from those described herein. Thus, scopes of the present disclosure are not limited by the following disclosed exemplary embodiments.

In a first aspect of the present disclosure, there is provided a mask assembly, for manufacturing a color filter substrate 100. The color filter substrate 100 comprises a color filtering region 50 and a plurality of marking regions 51, and the color filtering region 50 is divided into a plurality of pixel units, for example, pixel units 501 and 502, each comprising a plurality of sub-pixels of different colors arranged in a row direction. For example, the pixel unit 501 comprises sub-pixels 501*a*, 501*b* and 501*c*, and the pixel unit 502 comprises sub-pixels 502*a*, 502*b* and 502*c*. The mask assembly comprises a first mask 10 and a second mask 20.

Figure 5:
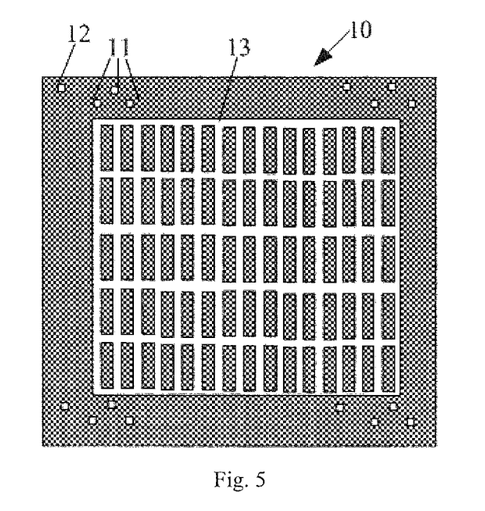
FIG. 5 is an overall structural schematic diagram of a first mask according to an embodiment of the present disclosure.
Figure 6:
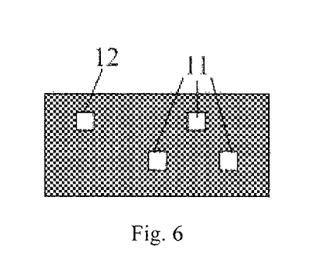
FIG. 6 is a schematic diagram showing a pattern of a black matrix marking mask within one marking region on a first mask, according to an embodiment of the present disclosure.
Figure 7:
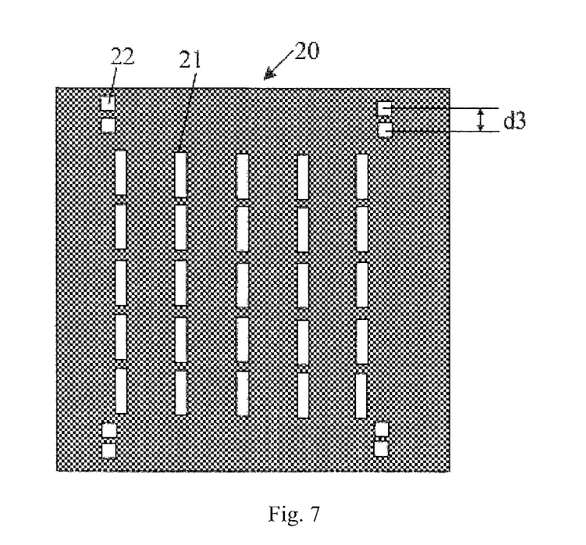
FIG. 7 is a structural schematic diagram of a second mask according to an embodiment of the present disclosure.
Figure 9:
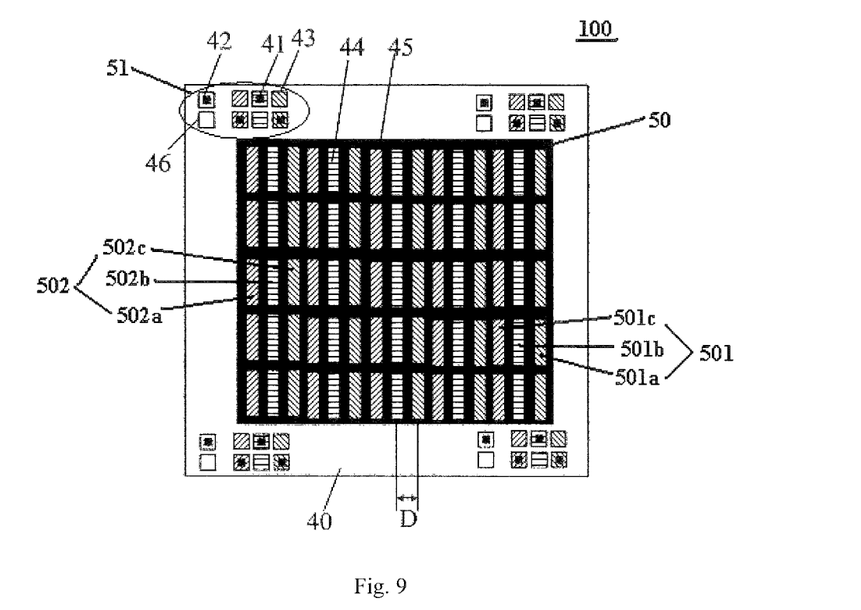
FIG. 9 is a structural schematic diagram of a color filter substrate according to an embodiment of the present disclosure.

The first mask 10 is configured for manufacturing a black matrix layer of the color filter substrate; as shown in FIG. 5 and FIG. 6, the first mask 10 is formed with a plurality of first black matrix marking mask patterns 11 at a position corresponding to each marking region, and a spacing between centers of two first black matrix marking mask patterns 11 that are the closet to each other among the first black matrix marking mask patterns 11 is not less than two times of a spacing between centers of two adjacent sub-pixels located in the same row (a spacing indicated by "D" shown in FIG. 9);

The second mask 20 is configured for manufacturing a color filter layer of the color filter substrate; as shown in FIG. 7, the second mask 20 is formed with a plurality of photoresist block mask patterns 21 at a position corresponding to the color filtering region in a one-to-one correspondence to a plurality of sub-pixels having the same one color, and with at least two photoresist marking mask patterns 22, which are located at a position corresponding to each of the marking regions and arranged in a column direction.

A plurality of first black matrix marking mask patterns 11 corresponding to the same marking region are configured to form a plurality of first projections within the marking region when the first mask 10 is aligned with the color filter substrate(that is, when the black matrix layer is formed by using the first mask 10), and a plurality of photoresist marking mask patterns 21 corresponding to the same marking region are configured to form a plurality of columns of second projections within the marking region when the photoresist block mask patterns 21 of the second mask are respectively aligned with sub-pixels of respective colors; in the same marking region, at least two of the first projections respectively correspond to different columns of the second projections, and the first projections are respectively located within corresponding second projections.

It will be appreciated by those skilled in the art that in the present disclosure, the color filtering region of the color filter substrate means a portion of the color filter substrate corresponding to a display area of a display panel when the color filter substrate is applied in the display panel. Each of the pixel unit and the sub-pixel represents a region. Photoresist blocks are arranged within each sub-pixel of the color filter substrate, and the color of the sub-pixel is the color of the photoresist block. the marking regions of the color filter substrate are located around the color filtering region, for example, one of the marking regions may be formed at a position of the color filter substrate adjacent to each corner of the color filter substrate; correspondingly, the position of the first mask corresponding to the marking region is a position adjacent to a corner of the first mask, and the position of the second mask corresponding to the marking region is a position adjacent to a corner of the second mask.

It will be appreciated that materials for manufacturing the color filter layer and the black matrix layer of the color filter substrate comprise photosensitive material(s), and the phrase "the first mask is configured for manufacturing a black matrix layer of the color filter substrate" used herein particularly means that during manufacturing the black matrix layer, a black matrix material layer is exposed to light through the first mask 10 to thereby form a desired pattern after being developed. Similarly, the phrase "second mask 20 is configured for manufacturing a color filter layer of the color filter substrate" used herein particularly means that during manufacturing the black matrix layer, a color filter material layer is exposed to light through the second mask 20 such that after the color filter material layer is developed, portions of the color filter material layer corresponding to the photoresist block mask patterns 21 are remained to form photoresist blocks of corresponding colors.

The first black matrix marking mask pattern 11 is a transparent pattern if a material of forming the black matrix is a negative photosensitive material, or has a opaque structure if the material of forming the black matrix is a positive photosensitive material; Similarly, both the photoresist block mask patterns 21 and the photoresist marking mask pattern 22 have transparent structures if a material of forming the color filter layer is a negative photosensitive material, or have opaque structure if the material of forming the color filter layer is a positive photosensitive material.

A plurality of first black matrix marking blocks 41 may be formed within each marking region through the first mask 10, and positions of the plurality of first black matrix marking blocks 41 respectively correspond to positions of a plurality of first projections. Since the spacing between centers of two first black matrix marking mask patterns 11 that are the closet to each other among the first black matrix marking mask patterns is not less than two times of the spacing between centers of two adjacent sub-pixels located in the same row, a spacing between centers of two, that are the closet to each other in distance, of the first black matrix marking blocks 41 formed through the first mask 10 is not less than two times of the spacing between centers of the two adjacent sub-pixels located in the same row.

Referring to FIG. 7 and FIG. 9 together, when a color filter layer is manufactured on a base substrate 40 by using the second mask 20 provided according to the present disclosure, a photoresist material layer of a first color may be firstly formed on the base substrate 40, and a plurality of the photoresist block mask patterns 21 of the second mask 20 are positioned to respectively correspond to sub-pixels of the first color; at this point, a plurality of the photoresist marking mask patterns 22 of the second mask 20 corresponding to any one marking region can form a column of first projections within the marking region; after exposure and development, a plurality of photoresist blocks of the first color are formed within the color filtering region of the base substrate, and a column of photoresist marking blocks 43 of a corresponding color are formed within each marking region; then, a photoresist material layer of a second color is formed, and the second mask 20 is translated by a distance (e.g., a distance D shown in FIG. 9), such that after exposure and development, a plurality of photoresist blocks of the second color are formed within the color filtering region of the base substrate, and photoresist marking blocks of a corresponding color are formed within each marking region. In a similar way, with the second mask 20, a plurality of photoresist blocks 44 of different colors may be formed within each pixel unit, and a plurality of photoresist marking blocks 43 may be formed within each marking region; the plurality of photoresist marking blocks 43 are arranged in M rows and N columns within any one of the marking regions, where $M \geq 2$, N is equal to the number of color kinds of the photoresist blocks, and N columns of photoresist marking blocks 43 correspond to N columns of second projections.

As can be seen from above, in order to manufacture photoresist blocks of different colors by using the same one mask in prior arts, a spacing between centers of second light transmission holes 2a of the mask for manufacturing the black matrix layer is equal to a spacing between centers of two adjacent sub-pixels in the same row, thus two black matrix markings 5 and corresponding photoresist block markings will be present in the detection window when the detection device is used to detect whether or not the black matrix marking and the corresponding photoresist block marking are aligned with each other (e.g., their centers coincide with each other), thereby resulting in reduced recognition rate of the detection device.

In the present disclosure, the color filter substrate is manufactured by using the mask assembly, the spacing between the centers of the two first black matrix marking blocks 41 that are the closest to each other among the first black matrix marking blocks 41 is increased relative to prior art. Thus, at most one black matrix marking will be present in the detection window when a detection is made by the detection device, and the recognition made by the detection device will not be affected even if two photoresist block markings are present in the detection window. Further, photoresist blocks of different colors may be manufactured by using the same second mask, thereby enabling improvement in detection accuracy without increasing manufacturing cost.

It will be understood that the plurality of photoresist marking mask patterns 22 do not contact with one another, and the plurality of first black matrix marking mask pattern 11s do not contact with one another either.

In an example, the number of the first black matrix marking mask patterns 11 of the first mask 10 formed at a position corresponding to any one of the marking regions is equal to the number of color kinds of the sub-pixels of the pixel unit, and the plurality of the first projections respectively correspond to a plurality of the second projections each located in different columns within the same marking region in a one-to-one relationship. Thus, when each pixel unit includes sub-pixels of N different colors, and the second mask 20 is formed with M photoresist marking mask patterns 22 at a position corresponding to each marking region, N first black matrix marking blocks 41 may be formed within each marking region by using the first mask 10, and M rows of and N columns of photoresist marking blocks 43 may be formed within each marking region by using the second mask 20, such that colors of photoresist marking blocks vary in different columns, and the N first black matrix marking blocks 41 are respectively covered by N photoresist marking blocks 43 of different colors. Thereby, it can be determined whether or not the positions of the photoresist blocks of respective colors within the color filtering region correspond to those of the black matrix by detecting whether or not the first black matrix marking block 41 is aligned with a corresponding photoresist marking block 43.

In an example, each the pixel unit includes three sub-pixels of different colors, and as shown in FIG. 7, the second mask 20 is formed with two photoresist marking mask patterns 22 at a position corresponding to each of the marking regions. As shown in FIG. 5 and FIG. 6, the first mask 10 is formed with three first black matrix marking mask patterns 11 at a position corresponding to each of the marking regions, such that two of the three first black matrix marking mask patterns 11 are located in the same row (that is, arranged in the row direction), and a perpendicular bisector for a connection line between centers of the two first black matrix marking mask patterns passes through the third one of first the three first black matrix marking mask patterns 11. In this example, the spacing between centers of two of the first black matrix marking mask patterns 11 that are the closest to each other among the first black matrix marking mask patterns is equal to two times of the spacing between centers of two adjacent ones of the sub-pixels.

Figure 10:
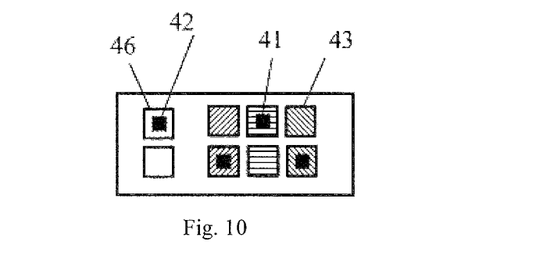
FIG. 10 is a structural schematic diagram showing one marking region of a color filter substrate according to an embodiment of the present disclosure.

In this case, after the black matrix layer is formed on the base substrate by using the first mask 10, and the color filter layer is formed on the base substrate by using the second mask 20, two rows of and three columns of photoresist marking blocks 43 and three first black matrix marking blocks 41 corresponding to the first black matrix marking mask pattern 11 are formed within each marking region on the base substrate 40, as shown in FIG. 9 and FIG. 10. Colors of the three photoresist marking blocks 43 in each row are different from one another, for example, includes R, G, B three colors, while the two photoresist marking blocks 43 in each column have the same color, and the three first black matrix marking blocks 41 are respectively covered by a second one of a first row of photoresist marking blocks 43 in the two rows, and first and third ones of a second row of photoresist marking blocks 43 in the two rows.

As shown in FIG. 5, the first mask 10 is further formed with a grid shaped black matrix mask patterns 13 at a position corresponding to the color filtering region, thereby a grid shaped black matrix 45 (as shown in FIG. 9) may be formed within the color filtering region on the base substrate while forming the first black matrix marking blocks 41 on the base substrate.

Figure 8:
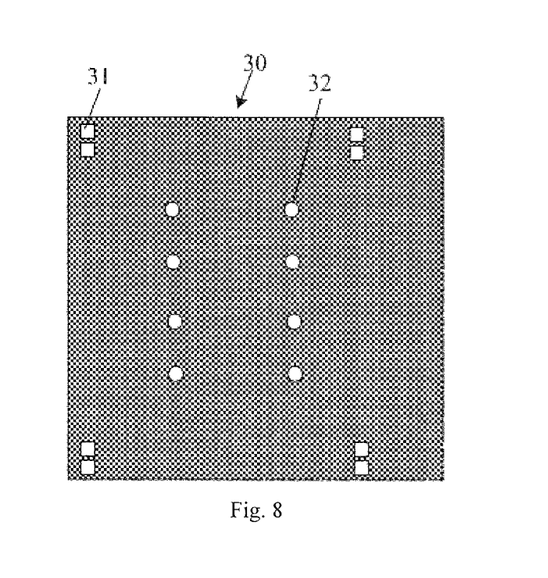
FIG. 8 is a structural schematic diagram of a third mask according to an embodiment of the present disclosure.

Further, the mask assembly further comprises a third mask 30 for forming a spacer layer of the color filter substrate, as shown in FIG. 8, the third mask 30 is formed with at least one spacer marking mask patterns 31 at a position corresponding to each of the marking regions, and the first mask 10 is further formed with a second black matrix marking mask pattern 12 at a position corresponding to each marking region. When both the first mask 10 and the third mask 30 are aligned with the color filter substrate, an orthogonal projection of the second black matrix marking mask pattern 12 on the color filter substrate is located within an orthogonal projection of the spacer marking mask pattern 31 on the color filter substrate. That is, when the black matrix layer is formed with the first mask 10 being aligned with the color filter substrate, a second black matrix marking block 42 (as shown in FIG. 9), which corresponds to the second black matrix marking mask pattern 12, may be formed within each marking region of the color filter substrate, and when a spacer layer is formed with the third mask 30 being aligned with the color filter substrate, a spacer marking block 46, which corresponds to the spacer marking mask pattern 31, may be formed within each marking region of the color filter substrate and covers the second black matrix marking block 42.

As shown in FIG. 8, the third mask 30 is further formed with a plurality of spacer mask patterns 32 at a position corresponding to the color filtering region, thereby a plurality of spacers may be formed within the color filtering region on base substrate, and the position of the spacer mask pattern 32 and the position of the black matrix mask pattern are set such that the spacer formed through the third mask is located on the black matrix formed through the first mask 10.

As shown in FIG. 9 and FIG. 10, a second black matrix marking block 42, which corresponds to the second black matrix marking mask pattern 12, may be further formed within each marking region of the color filter substrate while the first black matrix marking block 41 is formed through the first mask 10. At least one spacer marking block 46 may be formed within each of the marking region by using the third mask 30, and second black matrix marking block 42 is covered by the spacer marking block 46. Thus, it can be determined whether or not positions of the spacer and the black matrix formed within the color filtering region of the color filter substrate correspond to each other by detecting whether or not a center of the second black matrix marking block 42 is aligned with that of the spacer marking block 46.

In an example, each of the length and the width of the first black matrix marking mask pattern 11 is in a range of 45~50 μm, for example, is 48 μm; each of the length and the width of the second black matrix marking mask pattern 12 is in a range of 45~50 μm, for example, is 48 μm. The photoresist marking mask pattern 22 has a size larger than that of the first black matrix marking mask pattern 11 such that the first projection is located within the second projection. In an example, each of the length and the width of the photoresist marking mask pattern 22 is in a range of 85~95 μm, for example, is 90 μm. A size of the spacer marking mask pattern 31 may be the same as that of the photoresist marking mask pattern 22.

In an example, as shown in FIG. 7, a spacing d3 between centers of two adjacent photoresist marking mask patterns 22 formed at a position of the second mask 20 corresponding to the same marking region is in a range of 300~320 μm.

In a second aspect of the present disclosure, there is provided a method of manufacturing a color filter substrate by using the masks described above; the method comprises steps of:

S1: forming a black matrix material layer;

S2: exposing and developing the black matrix material layer through the first mask so as to form a plurality of first black matrix marking blocks corresponding to the first black matrix marking mask patterns; and S3: forming respectively photoresist blocks of a plurality of different colors, wherein forming the photoresist blocks of a respective one of the colors comprises:

S3*a*: form a photoresist material layer of the respective color; and

S3*b*: exposing and developing the photoresist material layer through the second mask so as to form a plurality of photoresist blocks of the respective color corresponding to the photoresist mask patterns while forming a plurality of photoresist marking blocks of the respective color corresponding to the photoresist marking mask patterns; and wherein at least two first black matrix marking blocks located within the same marking region are covered by the photoresist marking blocks of different colors.

It will be appreciated that when forming photoresist block of different colors, the second mask is located at a different position with respect to the base substrate. After the step S3, photoresist blocks of multiple colors are formed within the color filtering region on the base substrate 40, and a plurality of columns of photoresist marking blocks are formed within each marking region.

In an example, the number of the first black matrix marking mask patterns of the first mask 10 formed at a position corresponding to any one of the marking regions is equal to the number of color kinds of the photoresist blocks to be formed (i.e., the number of color kinds of sub-pixels as described above), and after the step S3, a plurality of the first black matrix marking blocks 41 located within the same marking region are respectively covered by a plurality of photoresist marking blocks 43 each having different colors, as shown in FIG. 9 and FIG. 10.

Further, as described above, the first mask 10 is further formed with second black matrix marking mask patterns 12 at a position corresponding to each of the marking regions, such that there are further formed in the step S2 with second black matrix marking blocks corresponding to the second black matrix marking mask patterns. The method further comprises, following the step S3, steps of:

S4: forming a spacer material layer; and

S5: exposing and developing the spacer material layer so as to form spacer marking blocks to cover the second black matrix marking blocks.

In a third aspect of the present disclosure, there is provided a color filter substrate manufactured by using the above method. As shown in FIG. 9 and FIG. 10, the color filter substrate comprises a color filtering region and a plurality of marking regions which are regions located at positions close to corners of the base substrate 40. The color filtering region is divided into a plurality of pixel units, and a plurality of photoresist blocks 44 of different colors are arranged in a row direction within each pixel unit. A plurality of photoresist marking block 43 are arranged in at least two rows within each of the marking regions, such that the photoresist marking blocks 43 located in different columns have different colors while the photoresist marking blocks 43 located in the same column have the same color, and that a spacing between centers of two adjacent ones of the photoresist marking blocks 43 located in the same row is equal to a spacing between centers of two adjacent photoresist blocks located in the same row (indicated by "D" shown in FIG. 9).

A plurality of first black matrix marking blocks 41 are further provided within each of the marking regions, such that at least two first black matrix marking blocks 41 located within the same marking region are respectively covered by the photoresist marking blocks of different colors, and that a spacing between centers of two first black matrix marking blocks 41 that are the closet to each other among the first black matrix marking blocks is not less than two times of a spacing between centers of two adjacent photoresist blocks 44 located in the same row.

In a marking region of the prior art color filter substrate, each of first black matrix marking blocks and a plurality of photoresist marking block of different colors are arranged in one column, and considering a common use of the mask, a spacing between two adjacent first black matrix marking blocks is too small and is equal to a spacing between centers of two adjacent photoresist blocks located in the same row.

Thus, when a detection device, which is configured to determine a position of an image through a profile of the image and cannot distinguish two colors from each other, is used to detect whether or not the photoresist marking block is aligned with the first black matrix marking block, there will be two identical first black matrix marking blocks and two similar photoresist marking blocks within a detection window, it is difficult to determine which one of the blocks present in the window is the photoresist marking block to be detected, thereby reducing accuracy of detection result.

In the color filter substrate provided in the present disclosure, & the same marking region, a spacing between centers of two adjacent photoresist marking blocks located in the same row is equal to a spacing between centers of two adjacent photoresist blocks located in the same row, thus photoresist blocks of different colors and photoresist marking blocks of different colors may be manufactured by using the same one mask when manufacturing the color filter substrate, thereby saving manufacturing cost. Further, a spacing between centers of two of the first black matrix marking blocks that are the closet to each other among the first black matrix marking blocks is not less than two times of a spacing between centers of two adjacent ones of the photoresist blocks located in the same row, such that when a detection device is used to detect whether or not the photoresist marking block is aligned with the first black matrix marking block, there will be only one first black matrix marking block within the detection window, and the detection device can determine a central position of the first black matrix marking block only based on a profile of the first black matrix marking block and determine a center of the photoresist marking block corresponding to the first black matrix marking block. Thus, only one set of detection values will be obtained at each detection, thereby improving accuracy of detection result.

In an example, the number of the first black matrix marking blocks 41 located within any one of the marking regions is equal to the number of color kinds of the photoresist blocks in the pixel unit, and a plurality of first black matrix marking blocks 41 located within the same marking region are respectively covered by plurality of photoresist marking blocks 43 of different colors.

In an example, three photoresist blocks 44 are provided within each pixel unit, a plurality of photoresist marking blocks 43 arranged in two rows and three columns and three first black matrix marking blocks 41 are provided within each of the marking regions, and the three first black matrix marking blocks 41 are respectively covered by a middle one of the photoresist marking blocks 43 in the first row and two photoresist marking blocks 43 located in the beginning and the end of the second row.

As shown in FIG. 9, at least one spacer marking block 46 and one second black matrix marking block 42 that is arranged in the same layer as the first black matrix marking block 41 are further provided within each of the marking regions, the second black matrix marking block 41 is covered by the spacer marking block 46, and a spacing between centers of the second black matrix marking block 42 and the first black matrix marking block 41 which is located at the nearest distance from the second black matrix marking block is not less than two times of a spacing between centers of two adjacent photoresist blocks 44 in the same row.

A grid shaped black matrix 45 is further arranged within the color filtering region of the color filter substrate in same layer as the first black matrix marking block 41, each grid corresponding to one photoresist block 44. The color filter substrate further comprises spacers provided on the black matrix 45, the first black matrix marking block 41, the second black matrix marking blocks 42 and the black matrix 45 may be formed simultaneously, and the spacer marking blocks 46 and the spacers may be formed simultaneously. After manufacturing of the color filter substrate is completed, it can be determined whether or not the spacers are formed on the black matrix within the color filtering region of the color filter substrate by determining whether or not the second black matrix marking block 42 and the spacer marking block 46 are aligned with each other (that is, whether or not their centers are aligned with or coindice with each other).

In an example, a cross section of the first black matrix marking block 41 has a rectangular shape with a length and a width each in a range of 45~50 μm, and a cross section of the second black matrix marking block 42 has a rectangular shape with a length and a width each in a range of 45~50 μm.

Of course, the first black matrix marking block 41 and the second black matrix marking block 42 may have other shapes, for example, a cylindrical shape with a circular cross section having a radius of 45~50 μm.

In an example, a spacing between centers of two adjacent photoresist marking blocks 43 of the same color located within the same marking region is in a range of 300~320 μm. The spacing between centers of two adjacent photoresist blocks 44 located in the same row is not limited in the present disclosure, and may be set according to requirements of a product, for example, may be in a range of 100~110 μm.

The shape of the photoresist marking block 43 is not limited in the present disclosure, for example, includes a cylindrical shape, a square column shape or the like, In an example, a cross section of the photoresist marking block 43 has a rectangular shape with a length and a width each in a range of 85~95 μm.

In a fourth aspect of the present disclosure, there is provided a detection device, for detecting whether or not the first black matrix marking block and its corresponding photoresist marking block of the color filter substrate described above are aligned with each other. In an example, the detection device comprises an image acquisition window for acquiring images of the first black matrix marking block and its corresponding photoresist marking block, the image acquisition window has a width smaller than the spacing between centers of two first black matrix marking blocks having the nearest distance therebetween, such that an image of one first black matrix marking block can only be acquired within the image acquisition window for each detection, a phenomenon where similar structures are present in the window and cannot be differentiated from each other is reduced, thereby improving detection accuracy.

In a fifth aspect of the present disclosure, there is provided a display device, comprising the above color filter substrate provided in the present disclosure.

Since detection accuracy is improved when detecting whether or not the first black matrix marking block and its corresponding photoresist marking block of the color filter substrate described above are aligned with each other, a color filter substrate having a poor quality can be prevented from entering a next process, thereby ensuring quality of the display device.

It will be appreciated that although several exemplary embodiments have been shown and described, it would be appreciated by those skilled in the art that various changes or modifications may be made in these embodiments without departing from the principle and spirit of the disclosure, the scope of which is defined in the claims and their equivalents.

What is claimed is:

1. A color filter substrate, comprising a color filtering region and a plurality of marking regions, the color filtering region being divided into a plurality of pixel units each comprising a plurality of photoresist blocks of different colors arranged in a row direction, wherein
a plurality of photoresist marking blocks are arranged in at least two rows within each of the marking regions, such that the photoresist marking blocks located in different columns have different colors while the photoresist marking blocks located in a same column have a same color, and such that a spacing between centers of two adjacent ones of the photoresist marking blocks located in a same row is equal to a spacing between centers of two adjacent ones of the photoresist blocks located in the same row; and
a plurality of first black matrix marking blocks are further provided within each of the marking regions, such that in a same marking region, at least two of the first black matrix marking blocks are covered by the photoresist marking blocks of different colors respectively, and such that a spacing between centers of two of the first black matrix marking blocks that are the closest to each other among the first black matrix marking blocks is not less than two times of a spacing between centers of two adjacent ones of the photoresist blocks located in the same row.

2. The color filter substrate according to claim 1, wherein the number of the first black matrix marking blocks located within any one of the marking regions is equal to the number of color kinds of the photoresist blocks in the pixel unit, and a plurality of the first black matrix marking blocks located within the same marking region are respectively covered by the photoresist marking blocks of different colors.

3. The color filter substrate according to claim 1, wherein three photoresist blocks are provided within each pixel unit, a plurality of the photoresist marking blocks arranged in two rows and three columns and three first black matrix marking blocks are provided within each of the marking regions, and the three first black matrix marking blocks are respectively covered by a middle one of the photoresist marking blocks in a first row and two photoresist marking blocks located at the beginning and the end of a second row.

4. The color filter substrate according to claim 1, wherein at least one spacer marking block and one second black matrix marking block that is arranged in a same layer as the first black matrix marking block are further provided within each of the marking regions, the second black matrix marking block is covered by the spacer marking block, and a spacing between centers of the second black matrix marking block and the first black matrix marking block which is located closest to the second black matrix marking block is not less than two times of a spacing between centers of two adjacent ones of the photoresist blocks in a same row.

5. The color filter substrate according to claim 4, wherein a cross section of the first black matrix marking block has a rectangular shape with a length and a width each in a range of 45~50 μm; and
a cross section of the second black matrix marking block has a rectangular shape with a length and a width each in a range of 45~50 μm.

6. The color filter substrate according to claim 1, wherein a spacing between centers of two adjacent photoresist marking blocks of a same color located within a same marking region is in a range of 300~320 μm.

7. The color filter substrate according to claim 1, wherein a cross section of the photoresist marking block has a rectangular shape with a length and a width each in a range of 85~95 μm.

8. The color filter substrate according to claim 1, wherein a grid shaped black matrix is further arranged within the color filtering region in a same layer as the first black matrix marking block, each grid corresponding to one of the photoresist blocks.

\* \* \* \* \*